(12) United States Patent
Ollier et al.

(10) Patent No.: US 9,193,582 B2
(45) Date of Patent: Nov. 24, 2015

(54) METHOD OF FORMING A SUSPENDED STRUCTURE AND A TRANSISTOR CO-INTEGRATED ON A SAME SUBSTRATE

(71) Applicant: COMMISSARIAT A L'ENERGIE ATOMIQUE ET AUX ENE ALT, Paris (FR)

(72) Inventors: Eric Ollier, Grenoble (FR); Julien Arcamone, St. Martin le Vinoux (FR); Mylene Savoye, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 17 days.

(21) Appl. No.: 14/097,733

(22) Filed: Dec. 5, 2013

(65) Prior Publication Data
US 2014/0162392 A1    Jun. 12, 2014

(30) Foreign Application Priority Data
Dec. 6, 2012   (FR) ...................................... 12 61734

(51) Int. Cl.
| H01L 21/00 | (2006.01) |
| B81C 1/00 | (2006.01) |
| H01L 27/06 | (2006.01) |
| H01L 27/12 | (2006.01) |

(52) U.S. Cl.
CPC ........... *B81C 1/00246* (2013.01); *B81C 1/0019* (2013.01); *H01L 27/0617* (2013.01); *H01L 27/1203* (2013.01); *B81C 2203/0728* (2013.01); *B81C 2203/0771* (2013.01)

(58) Field of Classification Search
CPC .................................. B81C 1/00; H01L 21/00
USPC .................................. 438/50, 48, 53
See application file for complete search history.

(56) References Cited

U.S. PATENT DOCUMENTS

| 6,087,701 | A | | 7/2000 | Bergstrom et al. | |
| 6,136,630 | A | * | 10/2000 | Weigold et al. | 438/50 |
| 6,677,176 | B2 | * | 1/2004 | Wong et al. | 438/50 |
| 6,930,367 | B2 | * | 8/2005 | Lutz et al. | 257/417 |
| 6,936,491 | B2 | * | 8/2005 | Partridge et al. | 438/48 |
| 7,402,449 | B2 | * | 7/2008 | Fukuda et al. | 438/53 |
| 7,435,612 | B2 | * | 10/2008 | Xiao et al. | 438/50 |

(Continued)

FOREIGN PATENT DOCUMENTS

| EP | 1 695 937 A2 | 8/2006 |
| FR | 2 943 654 A1 | 10/2010 |

OTHER PUBLICATIONS

French Preliminary Search Report issued Dec. 6, 2012, in French Patent Application No. 1261734 with English translation of category of cited documents.

(Continued)

*Primary Examiner* — Caleb Henry
(74) *Attorney, Agent, or Firm* — Oblon, McClelland, Maier & Neustadt, L.L.P.

(57) ABSTRACT

A method of forming a microelectronic device comprising, on a same substrate, at least one electro-mechanical component provided with a suspended structure and at least one transistor, the method comprising a step of release of the suspended structure from the electromechanical component after having formed metal interconnection levels of components.

15 Claims, 9 Drawing Sheets

(56) References Cited

U.S. PATENT DOCUMENTS

| | | | |
|---|---|---|---|
| 7,449,355 B2* | 11/2008 | Lutz et al. | 438/50 |
| 7,767,484 B2* | 8/2010 | Ayazi | 438/52 |
| 7,863,069 B2* | 1/2011 | Weigold | 438/50 |
| 7,868,403 B1 | 1/2011 | Ivanov et al. | |
| 7,985,611 B1 | 7/2011 | Ivanov et al. | |
| 8,183,078 B2 | 5/2012 | Ollier et al. | |
| 8,211,729 B2 | 7/2012 | Dupre et al. | |
| 8,580,597 B2 | 11/2013 | Ollier et al. | |
| 8,897,470 B2* | 11/2014 | Huang et al. | 381/174 |
| 2006/0205106 A1 | 9/2006 | Fukuda et al. | |
| 2009/0049911 A1 | 2/2009 | Fukuda et al. | |
| 2009/0064785 A1 | 3/2009 | Fukuda et al. | |
| 2009/0243004 A1* | 10/2009 | Lan et al. | 257/415 |
| 2009/0325335 A1* | 12/2009 | Perruchot et al. | 438/50 |
| 2010/0044147 A1* | 2/2010 | Wang | 181/164 |
| 2010/0273286 A1* | 10/2010 | Liang et al. | 438/50 |
| 2010/0317138 A1* | 12/2010 | Lan et al. | 438/52 |
| 2012/0009713 A1 | 1/2012 | Ollier et al. | |
| 2012/0126433 A1* | 5/2012 | Montanya Silvestre | 257/787 |
| 2013/0105920 A1* | 5/2013 | Herrin et al. | 257/415 |
| 2013/0280842 A1* | 10/2013 | Partridge et al. | 438/51 |
| 2015/0008541 A1* | 1/2015 | Hong | 257/415 |
| 2015/0021720 A1 | 1/2015 | Ollier et al. | |

OTHER PUBLICATIONS

J. Teva, et al., "From VHF to UHF CMOS-MEMS Monolithically Integrated Resonators", IEEE International Conference on Micro Electro Mechanical Systems 2008, MEMS 2008, Jan. 13-17, 2008, pp. 82-85.

J. Verd, et al., "Monolithic 0.35-μm CMOS Cantilever for Mass Sensing in the Attogram Range With Self-Excitation", Transducers and Eurosensors '07, the $14^{th}$ International Conference on Solid-State Sensors, Actuators and Microsystems, Jun. 2007, pp. 233-236.

Chih-Ming Sun, et al., "Monolithic integration of capacitive sensors using a double-side CMOS MEMS post process", Journal of Micromechanics and Microengineering, 19, 015023, 2009, 1 front page, 9 pages.

Timothy J. Brosnihan, et al, "Embedded Interconnect and Electrical Isolation for High-Aspect-Ratio, SOI Inertial Instruments" Transducers '97, 1997 International Conference on Solid-State Sensors and Actuators, Jun. 16-19, 1997, pp. 637-640.

Bradford S. Davis, et al, "A Monolithic High-g SOI-MEMS Accelerometer for Measuring Projectile Launch and Flight Accelerations", Proceedings of the IEEE Sensors 2004, 2004, pp. 296-299.

E. Ollier, et al., "Ultra-Scaled High-Frequency Single-Crystal SI NEMS Resonators and Their Front-End Co-Integration With CMOS for High Sensitivity Applications", Micro Electro-Mechanical System MEMS 2012 Conference, 2012, 4 pages.

* cited by examiner

METHOD OF FORMING A SUSPENDED STRUCTURE AND A TRANSISTOR CO-INTEGRATED ON A SAME SUBSTRATE

TECHNICAL FIELD

The present invention relates to the field of microelectronic devices provided with at least one component with suspended structure such as NEMS (Nano Electro Mechanical Systems) and/or MEMS (Micro Electro Mechanical Systems) components or sensors, co-integrated on a same substrate with at least one electronic circuit component, in particular a transistor.

It applies for example to the formation of devices provided with an inertial sensor (accelerometer and/or gyrometer), a weight sensor, or an RF device provided with electromechanical resonators (time reference, filter, VCO, etc.).

PRIOR ART

It is known to wish to integrate, on a same substrate, a NEMS and/or MEMS component with one or more transistors of a CMOS circuit.

An approach, known as "pre-CMOS", provides for the formation of a MEMS structure before forming the components of the CMOS circuit.

According to another approach, known as "intermediate-CMOS", the steps of forming the CMOS circuit known as "Front-End" or those known as "Back-End" are interrupted in order to form the MEMS structure.

A third approach known as "post-CMOS", provides for defining the MEMS structure after the CMOS components, which imposes important constraints on the choice of materials and the conditions of the method used in order to respect thermal budget constraints in particular.

A drawback common to these different approaches is linked to the number of manufacturing steps needed to form the MEMS component and the CMOS circuit.

The document "From VHF to UHF CMOS-MEMS monolithically integrated resonators", Teva et al., IEEE-MEMS January 2008, discloses for example an "intermediate-CMOS" type method wherein the suspended mechanical structure of an MEMS is formed from layers of polysilicon also used to form the gate of a MOS transistor.

The use of this polycrystalline silicon layer to form the suspended structure of a MEMS component limits the mechanical performances and the reliability of the component, as well as the accessible structure thicknesses.

The document "Monolithic 0.35 µm CMOS cantilever for mass sensing in the attogram range with self excitation", of J. Verd et al., Transducers and Eurosensors '07, and the document "Monolithic integration of capacitive sensors using a double-side CMOS MEMS post process", Chih-Ming Sun et al., J. Micromech. Microeng., disclose for example a "post-CMOS" type method, wherein the MEMS suspended structure is formed in a metal layer.

A MEMS suspended structure based on such a metal layer poses size problems, is provided with limited mechanical performances, is temperature-sensitive, and is difficult to implement.

To limit the number of steps of the formation method and to improve the mechanical properties of the MEMS, it is known, for example from the document U.S. Pat. No. 8,183,078, to form the mechanical structure of the latter in a same layer as the channel of the transistors, in particular in a layer of monocrystalline silicon.

The document U.S. Pat. No. 7,985,611 also provides for the formation of a transistor and a MEMS suspended structure in a same layer.

The document EP 1 695 also provides for the formation of a transistor and a MEMS suspended structure on a same substrate.

The problem is posed of finding an improved method of forming a microelectronic device comprising an electromechanical system of MEMS and/or NEMS type provided with a suspended structure, as well as one or more transistors formed on a same substrate.

DESCRIPTION OF THE INVENTION

The present invention relates to a method of forming a microelectronic device comprising, on a same substrate comprising a semi-conducting layer, at least one component provided with at least one suspended structure and at least one transistor, the method comprising the steps consisting in:

a) forming in a first region of the semi-conducting layer one or more sacrificial blocks arranged on either side or around at least one given block of said semi-conducting layer intended to form at least one portion of a suspended structure of said component, forming openings in said semi-conducting layer then, filling the openings with at least one dielectric material, one or several first opening(s) being filled with dielectric material so as to form said sacrificial blocks, one or several second opening(s) being filled with dielectric material so as to form one or more electrical insulating block(s) of the component, b) forming a transistor from a second region of said semi-conducting layer, c) forming one or more interconnection levels in at least one insulating layer arranged on said semi-conducting layer, d) forming at least one cavity in the insulating layer so as to reveal at least partially said given block intended to form at least one part of suspended structure and so as to reveal at least partially the sacrificial blocks on either side of said given semi-conducting block, e) removing in said cavity said sacrificial blocks around said given semi-conducting block, so as to release said given block forming the suspended structure.

The channel of the transistor may be provided in the semi-conducting layer, whereas the gate of the transistor may be formed at step b) on this semi-conducting layer.

The given block of the semi-conducting layer may be formed on a sacrificial layer that is removed at least partially at step e) during the release.

According to the invention, at step a), the second opening(s) filled with dielectric material form an insulating closed contour around the electro-mechanical component.

An electrical insulation is thus formed between the component(s) situated inside the contour and other elements situated outside the closed contour.

This insulating closed contour around the electro-mechanical component is thereby conserved at the end of step e) of removal of the sacrificial blocks.

According to a first implementation possibility, said insulating contour may be integrally formed of insulating blocks.

In this case, at step d) of forming the cavity in the insulating layer, the insulating layer is preserved above the insulating blocks and at step e) of removal of the sacrificial blocks, the insulating blocks are entirely conserved.

According to a second implementation possibility, at the end of step e), this insulating contour may be formed of portions of the second openings wherein the dielectric material for filling the second openings has been conserved during step d) and portions of the second openings wherein the dielectric material for filling the second openings has been removed during step d).

The component may be a MEMS and/or NEMS electro-mechanical component, and according to one possibility, be provided with a moveable suspended structure.

According to a variant, the suspended structure may be a detection structure, the component then being for example a sensor.

Forming the structure intended to be suspended before forming the transistors and the interconnections makes it possible to limit the constraints in terms of materials used, thermal budget, alignment, choice of design geometries, limit dimensions of structures and reducing the mechanical stresses generated in the device during its manufacture. According to the invention, the component may be formed without perturbing the steps of forming the transistor since these are carried out subsequently, for example by following a CMOS type technology.

The semi-conducting layer may be based on monocrystalline silicon.

It is thus possible to form a suspended structure having good mechanical properties, in particular in terms of reliability, quality factor, Young's modulus and elasticity.

The interconnection levels may comprise at least one connection between the component and the transistor.

The given block forming the suspended structure is anchored to the rest of the structure of the component by portions that have not been etched during step e).

During step a), it is possible to form several other blocks of semi-conducting material, at least one of which is intended to form means for controlling and/or detecting the component, for example in the form of electrodes or piezoresistive gauges.

According to an implementation possibility, the sacrificial layer may be an insulating layer of a semi-conductor on insulator substrate comprising a semi-conducting support layer overlain by said insulating layer. The substrate may be for example a SOI substrate.

According to an implementation possibility, the sacrificial layer may only be present locally under the semi-conducting layer and for example only be formed in a zone of the first region.

According to an implementation possibility, the sacrificial blocks may be based on dielectric material.

The filling of the first opening(s) may be carried out using a dielectric material different from the dielectric material for filling the second opening(s).

According to an implementation possibility, the openings may be formed through a stop layer resting on the semi-conducting layer, the method further comprising, after filling the openings with the dielectric material, a step of removal of the dielectric material extending beyond the mouth of the openings by planarization until the stop layer is reached.

After filling the openings, it is possible to carry out an overall planarization of the substrate. The stop layer may then serve to mark the end of the planarization.

Step e) may be carried out by means of a single etching or potentially several etching sub-steps.

Between step d) and step e) it is possible to form a protective layer covering the sides and the bottom of the cavity, an opening then being made in said protective layer so as to reveal said given semi-conducting block and said sacrificial blocks arranged on either side of said given semi-conducting block.

The protective layer is provided to protect the insulating layer(s) of the connection levels at step e) which may be formed by etching through said opening.

According to an implementation possibility, step e) may be carried out by selectively etching the material of the sacrificial layer and the sacrificial blocks with respect to the semi-conducting material.

The protective layer may then be based on a material resistant to said selective etching.

According to a variant, the protective layer may be partially etched during step e) but provided sufficiently thick so as not to be totally removed at the end of the etching at step e).

According to an implementation possibility, the protective layer may be based on a material resistant to an etching carried out at step e) of the material of the sacrificial blocks and to an etching carried out at step e) of the sacrificial layer arranged under said revealed part of said given block.

According to an implementation possibility of the method, the cavity formed at step d) may comprise sloping sides with respect to a normal to the principal plane of the substrate.

These sloping sides may, depending on the type of deposit used for the protective layer, favour the covering of the sides by this layer and/or favour step e) of removal.

According to an implementation possibility of the method the second opening(s) may comprise sloping sides with respect to a normal to the principal plane of the substrate.

According to an implementation possibility of the method, at step c) of forming one or more electrical connection levels, it is possible to form an insulating layer and contacts for the transistor and for the electromechanical component in this insulating layer.

The formation of electrical connection levels comprises the formation of a connection conducting line between the electro-mechanical component and the electronic component, this connection line passing above at least one of the insulating blocks.

Step c) may further comprise the formation of at least one other insulating layer on the insulating layer containing the contacts, the other insulating layer(s) containing electrical interconnection levels connected to said contacts.

According to an implementation possibility of the method, after step a) and prior to step c), it is possible to form zones doped in the first region of the semi-conducting layer, the method further comprising a step of activation annealing of the dopants of the doped zones of the first region and of said second region.

The activation annealing may be carried out during step b) or subsequently.

The transistor comprises a source, a drain and a gate. The formation of the doped zones of the first region may be carried out after the formation of the gate of the transistor and potentially during the formation of doped zones forming the source and the drain.

Thus, certain steps of forming the transistor and electromechanical component may be merged together, for example the steps of electrical interconnections and the steps of activation of dopants.

BRIEF DESCRIPTION OF DRAWINGS

The present invention will be better understood on reading the description of embodiment examples given purely by way of indication and in no way limiting and by referring to the appended figures, among which.

Identical, similar or equivalent parts of the different figures bear the same numerical references so as to make it easier to go from one figure to the next.

The different parts represented in the figures are not necessarily shown at the same scale, in order to make the figures easier to read.

DETAILED DESCRIPTION OF PARTICULAR EMBODIMENTS

An example of method according to the invention of forming a microelectronic device provided with a component with suspended semi-conducting structure, such as for example an electro-mechanical component, and at least one electronic component integrated on a same substrate, will now be given with reference to FIGS. 1A-1I (in which the device during formation is represented according to a transversal sectional view X'X) and in FIGS. 2A-2D (in which a region of the device in which the electro-mechanical component is formed is represented according to a top view).

The starting material of this method may be a substrate on which, in a region A, at least one electronic component such as a transistor, for example using CMOS technology, is intended to be formed, whereas in another region B, at least one component with suspended structure, for example an electromechanical component, of MEMS or NEMS resonator type is intended to be formed.

The substrate comprises at least one layer known as "sacrificial" overlain with a layer known as "technological", preferably semi-conducting, in which the suspended structure of the electromechanical component and at least one part of an electronic component, in particular the channel of the transistor, are intended to be formed.

The sacrificial layer and the technological layer are provided based on different materials that can be etched in a selective manner with respect to each other.

In this example, the substrate is of semi-conductor or insulator type, and comprises a support layer 100 based on semi-conducting material, for example silicon, an insulating layer 101 covering the support layer 100, and which may be based on $SiO_2$. The insulating layer 101 can play the role of said sacrificial layer and is covered with a thin semi-conducting layer 102 being able for its part to play the role of said technological layer. The thin semi-conducting layer 102 may be formed of monocrystalline silicon and has a thickness that may be comprised between several tens of nanometers and several microns or tens of microns, for example of the order of 1 μm.

A planarization stop layer 105, which may be based on a dielectric material such as for example $Si_3N_4$, is firstly formed on the thin semi-conducting layer 102.

Figure 1A:
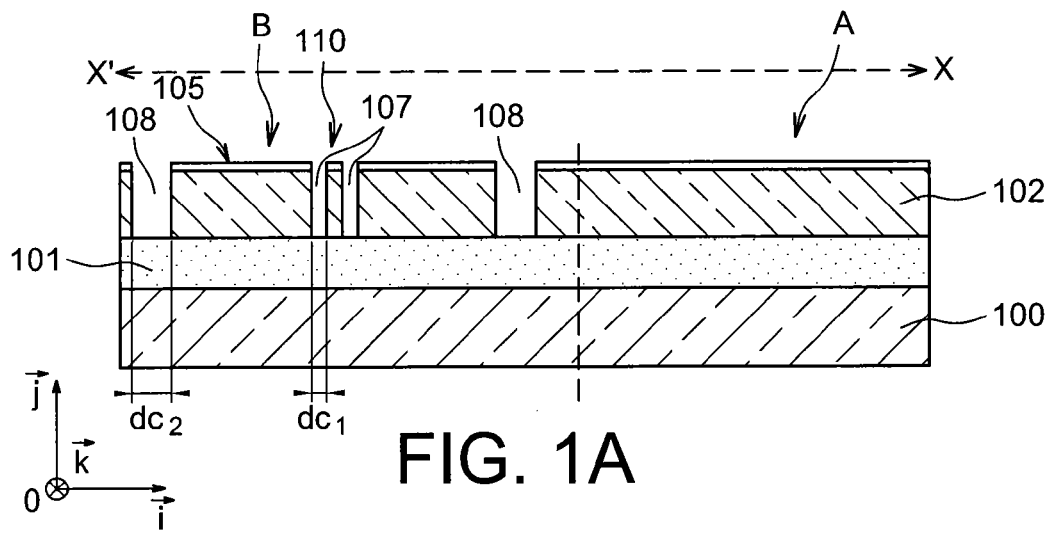
FIGS. 1A-1I, illustrate an example of method according to the invention of forming a microelectronic device provided with at least one electro-mechanical component and at least one electronic component co-integrated on a same substrate.
Figure 2A:
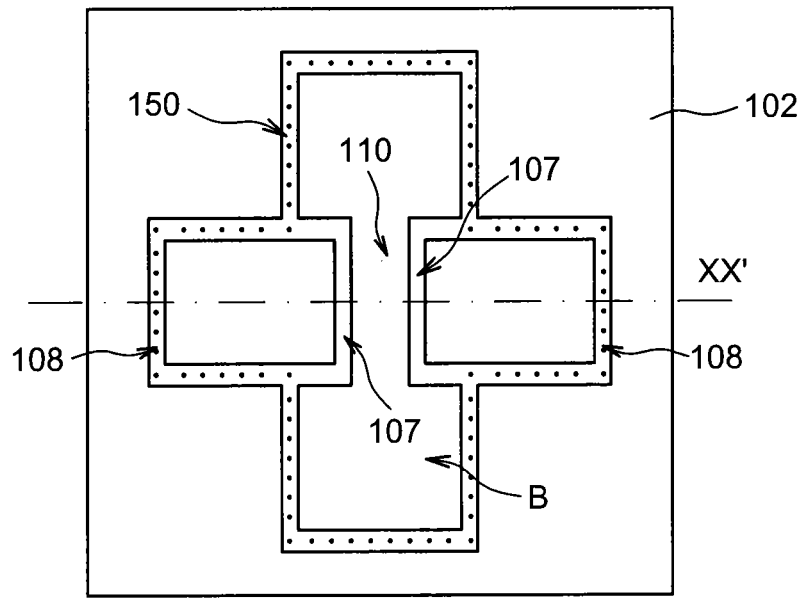
FIGS. 2A-2D illustrate certain steps of the example of method of manufacturing in a region of the device in which the suspended structure of the component is situated.

After having defined patterns by photolithography, an anisotropic etching of this stop layer 105 and the thin semi-conducting layer 102 is then carried out, so as to form holes 107 and trenches 108 in the thin semi-conducting layer 102. By this etching of the thin semi-conducting layer 102, a given block 110, intended to form at least one part of suspended structure of the MEMS component, is formed. The block 110 may be intended for example to form a resonator beam (FIGS. 1A and 2A). The trenches 108 form an insulating closed contour 150 around the electro-mechanical component. According to a variant (not represented), the closed contour may also be formed around circuits comprising transistors.

The insulating closed contour is intended to form an electrical insulation between the electro-mechanical component situated inside the contour and one or more elements situated outside, in this example the transistor T.

The formation of holes 107 and trenches 108, may be simultaneous or instead by successive steps, this latter approach being able to enable the formation of patterns of trenches and holes having different shapes.

The widths of the trenches 108 and holes 107 are provided sufficiently wide to make it possible to obtain the desired operation of the electromechanical structure as well as a good insulation of the blocks of the thin semi-conducting layer 102 while limiting in particular parasitic coupling phenomena, and sufficiently narrow to enable optimal filling with the dielectric material 111.

The holes 107 may be provided narrow, for example in the case of the formation of a NEMS with suspended structure actuated by electrostatic command or making it possible to implement a capacitive detection. It is for example possible to implement holes 107 of width $dc_1$ also known as critical dimension (dimension measured in a direction parallel to the plane $[O; \vec{i}; \vec{j}]$ of the reference point $[O; \vec{i}; \vec{j}; \vec{k}]$ given in FIG. 1A) of several tens to several hundreds of nm when the layer 102 has a thickness comprised between several hundreds of nm and several microns or instead of several microns when the layer 102 has a thickness comprised between several microns and several tens of microns.

The trenches 108 may be provided sufficiently wide to make it possible to avoid phenomena of parasitic coupling between the structure situated inside the closed contour 150 and the device situated outside the contour.

The trenches 108 may be provided with a width or critical dimension $dc_2$ of the order of a micron or several microns when the thickness of the layer 102 is comprised between several hundreds of nm and several tens of microns.

A filling of the holes 107, and trenches 108 with dielectric material 111 is then carried out, for example based on $SiO_2$. The dielectric material 111 for filling the trenches 108 and the holes 107 is preferably provided to be able to be etched selectively with respect to the thin semi-conducting layer 102.

The dielectric material 111 for filling the trenches 108 is preferably chosen so as to limit stresses at the level of the thin semi-conducting layer 102. Said dielectric material 111 for filling may be of the type of that, or identical to that, of the insulating layer 101, for example $SiO_2$.

The filling of the holes 107 and trenches 108 may be carried out in a simultaneous or instead successive manner, the latter approach making it possible to enable the carrying out of filling of the holes 107 with a material different to that of the trenches 108.

The dielectric material 111 extending beyond the mouth of the holes 107 and the trenches 108, and situated on the masking 105, may then be removed. This removal may be carried out by CMP (chemical mechanical polishing) commonly known as planarization while using the layer 105 as stop layer. The dielectric masking 105 is then removed by etching, for example using orthophosphoric acid $H_3PO_4$, selective vis-à-vis the insulating layer 102 and the dielectric material 111.

Figure 1B:
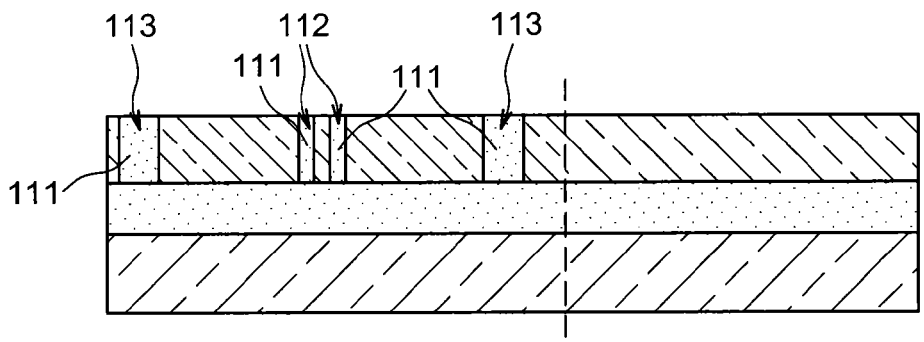

Blocks based on dielectric material 111 are thereby formed at the level of the thin semi-conducting layer 102. Among these blocks, first blocks 112 formed against and on either side of the given block 110 of semi-conducting material, are called "sacrificial blocks" in so far as they are intended to be eliminated, whereas second blocks 113 formed around the given block 110 and sacrificial blocks are called "insulating blocks" in so far as they are intended to electrically insulate the electromechanical component from the remainder of the device, and in particular from the electronic component (FIG. 1B).

Figure 2B:
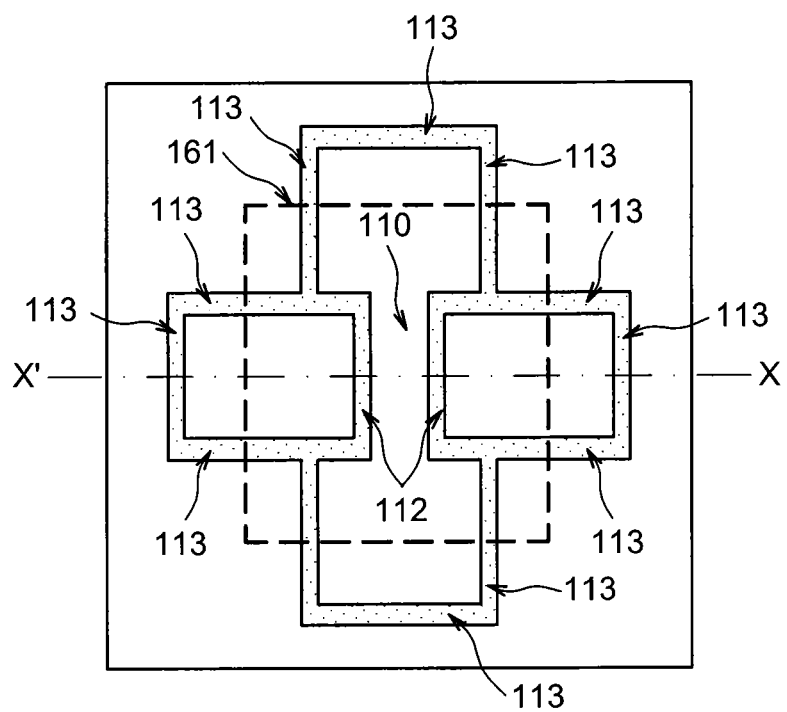
Figure 2C:
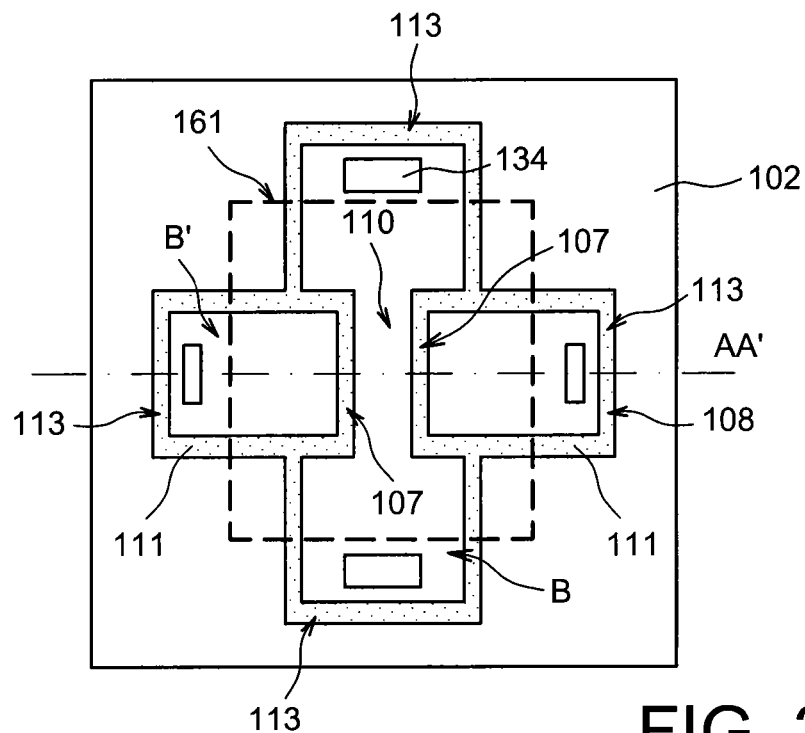

All of the insulating blocks 113 may be laid out so as to form an insulating closed contour around the electro-mechanical component (FIG. 2B).

According to a variant (not represented), an insulating contour may also be formed around circuits comprising transistors In the region A of the substrate, at least one transistor T is then formed.

The formation of this transistor T may comprise steps of defining an active zone in the thin semi-conducting layer 102 delimited by insulating blocks 127, for example using a LOCOS type method, formation of a doped N-well or P-well region 120 on which are defined a source zone 121 and a drain zone 122, for example by implantation, formation of a gate dielectric zone 125 and a gate 126, formation of zones 129 known as extension zones of LDD and/or PDD type, and formation of insulating spacers 128 on either side of the gate.

During the formation of the transistor T or after having formed the transistor T, for example after formation of the gate 126 and prior to the formation of a dielectric layer on which interconnection levels are intended to be formed, it is possible to carry out, in the region B of the substrate, a doping of zones 114 of semi-conducting materials of the thin semi-conducting layer 102. This doping may be carried out simultaneously to that of certain zones of the transistor: N-well zone, P-well zone, extensions, doping of the source zone, doping of the drain zone.

This doping is carried out at this stage of the method when high concentrations of dopants, for example of the order of at least $10^{19}$ atoms*$cm^{-3}$ or $10^{20}$ atoms*$cm^{-3}$ are implemented in zone B. It is thus possible to have easy access to the technological layer 102 and avoid any problems of diffusion or release of dopants during the preceding steps of formation of the transistor. The doping of the mechanical structure may be carried out by successive implantations with different implantation energies in order to obtain a uniform doping in thickness of the thin semi-conducting layer 102 in the region B. In a variant, this doping may be carried out at the very start of the method during the formation of the starting substrate.

Figure 1C:
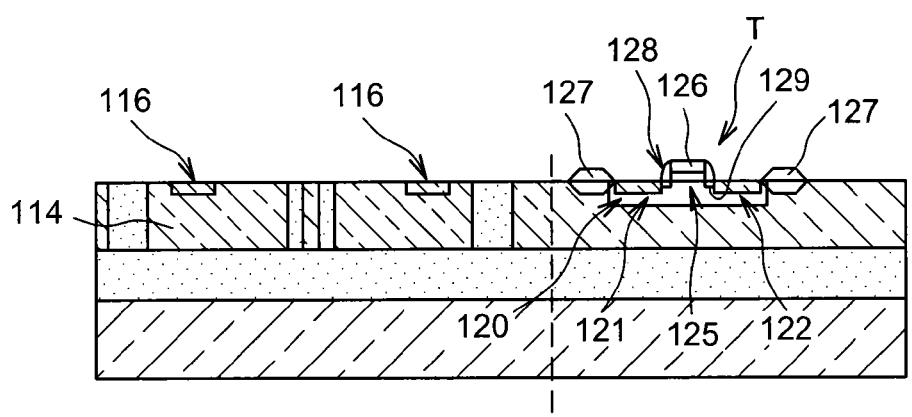

Certain zones 116 situated on the surface of the thin semi-conducting layer 102 are for their part strongly doped in order to assure a high quality electrical contact during the subsequent formation of regions for establishing contact(s) (FIG. 1C).

The activation annealing(s) of the dopants implanted in the thin semi-conducting layer 102 at the level of the second region B may be carried out at the same moment as those of the dopants implanted for the formation of the transistor T.

In a variant, a low doping, for example below $10^{19}$ atoms*$cm^{-3}$, of the thin semi-conducting layer at the level of region B may be carried out even before the formation of the given block 110 for example by intrinsic doping during the formation of the layer 102, in particular when it is partially formed by epitaxy.

Then, zones 133 of semi-conducting alloy and metal may be formed, for example by silicidation.

An insulating layer 131 of PMD (Pre Metal Dielectric) type may then be formed for example based on $SiO_2$ or other dielectrics, on which interconnection levels are intended to be formed.

PMD type openings are then formed in the insulating layer 131 of which certain reveal highly doped zones 116 and potentially the zones 133 of semi-conducting alloy and metal of the region B of the substrate, other openings formed in the region A revealing respectively the source region, the gate, and the drain region of the transistor T.

Then, the openings passing through the PMD insulating layer 131 are filled with metal material 132, for example tungsten, in order to form contacts 134a, 135a, 136a, 134b, 135b. The deposition of metal material may potentially be preceded by a barrier layer, for example based on Ti/TiN, and may be followed by a step of CMP planarization to remove the metal material extending beyond the mouth of the openings.

Figure 1D:
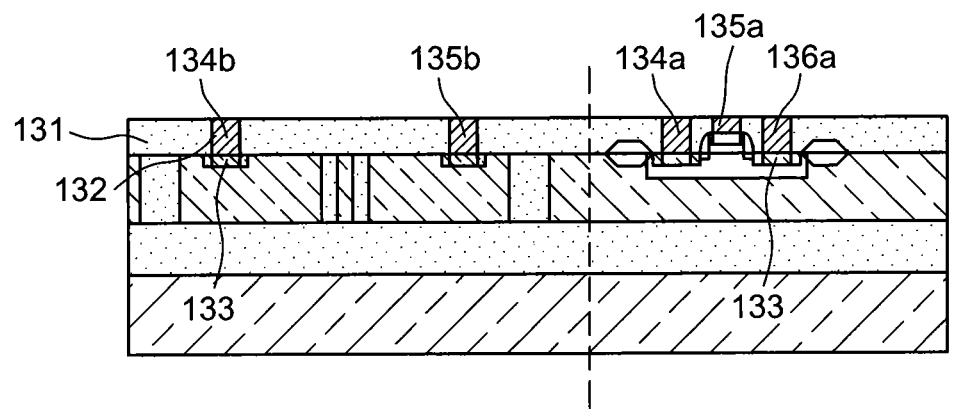

In the first region A of the substrate 100, contacts 134a, 135a, 136a are thereby formed on the source zone, the gate and the drain zone of the transistor T, whereas in the second region B of the substrate 100, contacts 134b, 135b are formed for the electro-mechanical component (FIG. 1D).

Steps known as "Back-end" are then carried out, to form one or more interconnection metal levels each comprising one or several horizontal conducting lines, the interconnection levels being connected together by means of vertical interconnections commonly known as vias, all of the vias and horizontal conducting lines being formed in a stack 143 of insulating layers.

The formation of the interconnection metal levels generally speaking comprises a succession of deposits of dielectric material(s) such as TeOS oxide, PSG and metal such as Al, Cu, AlSi, AlCu, which are structured for example by steps of photolitho-etching and CMP planarization. The vias may be made for example of tungsten.

Figure 1E:
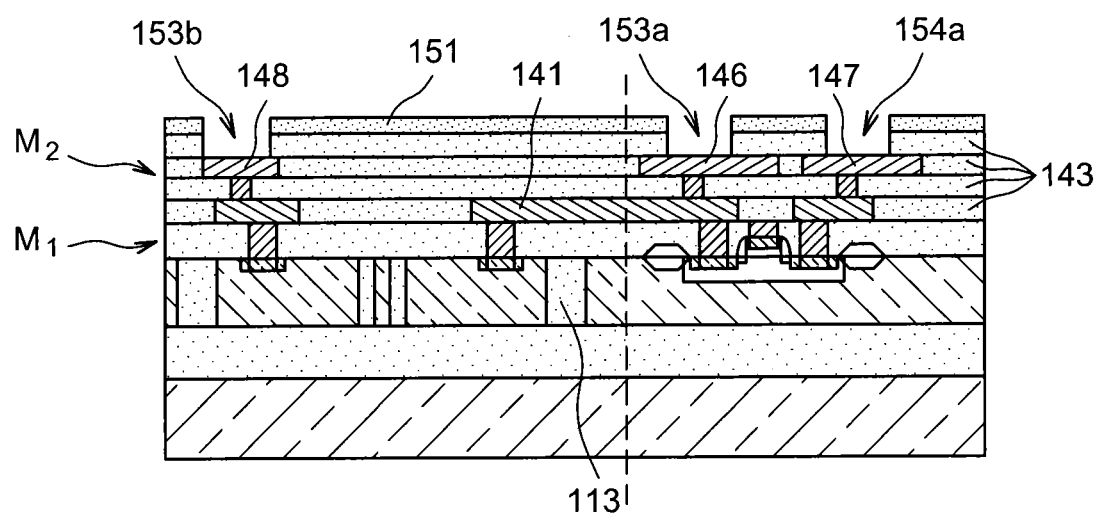

In the embodiment example illustrated in FIG. 1E, two interconnection metal levels $M_1$, $M_2$, are formed on the PMD type insulating layer 131. The transistor T and the electromechanical component are insulated by means of an insulating block 113 but electrically connected by means of a conducting line 141 which passes above said insulating block 113. This conducting line 141 may, as an example, belong to the first interconnection metal level $M_1$.

On the stacking 143 of insulating layers, a layer 151 may then be formed, for example based on a dielectric material such as $Si_3N_4$, in which are made holes facing the conducting lines 146, 147, themselves situated facing the first region A of the substrate in which the transistor T is formed, and holes facing conducting lines 148, themselves situated facing the region B of the substrate in which the electro-mechanical component is formed.

An etching of the stacking through the holes of the layer 151 is then carried out, so as to form, in their extension, openings 153a, 154a above the region A of the substrate in which the transistor T is formed, as well as openings 153b at the level of the region B of the substrate in which the electro-mechanical component is formed.

The openings 153a, 154a, 153b, reveal respectively zones of conducting lines 146, 147, 148, belonging in this example to the second interconnection metal level $M_2$ (FIG. 1E). These revealed zones constitute electrical contact pads of the device, making it possible to electrically connect the component to external components or a device.

Facing the region B of the substrate, at least one cavity 161 passing through the stacking 143 of insulating layers wherein the interconnection metal levels $M_1$, $M_2$ are formed (FIG. 1F) is then formed by photolitho-etching.

Figure 6A:
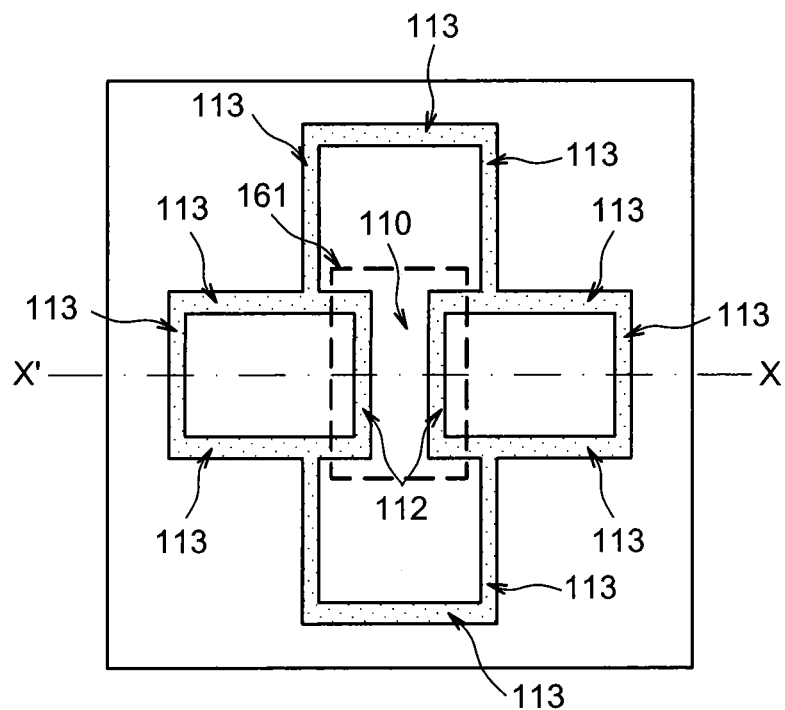
FIGS. 6A-6B illustrate an embodiment variant of the method according to the invention.

This cavity 161 reveals the semi-conducting block 110 of suspended structure of the electromechanical component as well as sacrificial blocks 112 of dielectric material 111 arranged on either side of the semi-conducting block 110. The cavity 161 may be formed such that the insulating blocks 113 are revealed only partially by the cavity 161 and are thereby partially protected by the stacking of insulating layers (FIG. 2C, on which the cavity 161 is delimited laterally by a contour in broken lines). In a variant, the cavity 161 may be formed such that the insulating blocks 113 are not revealed by the cavity 161 and are thereby protected by the stacking of insulating layers (FIG. 6A).

Figure 1F:
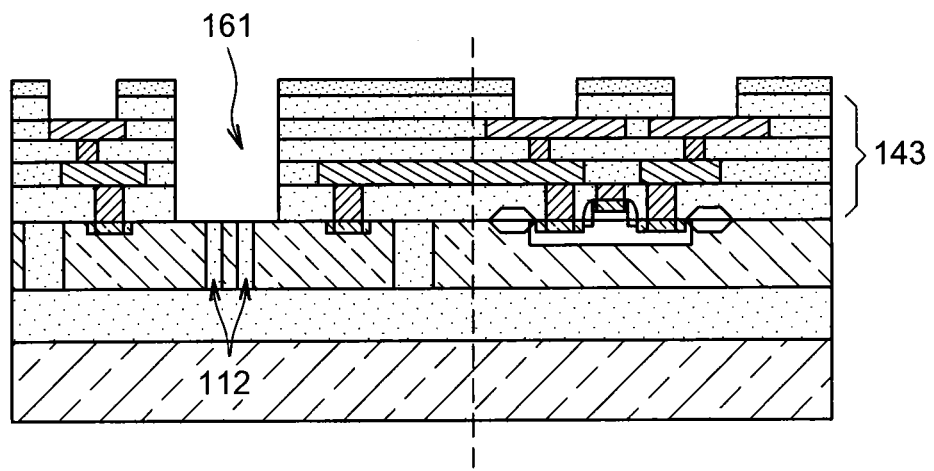
Figure 1G:
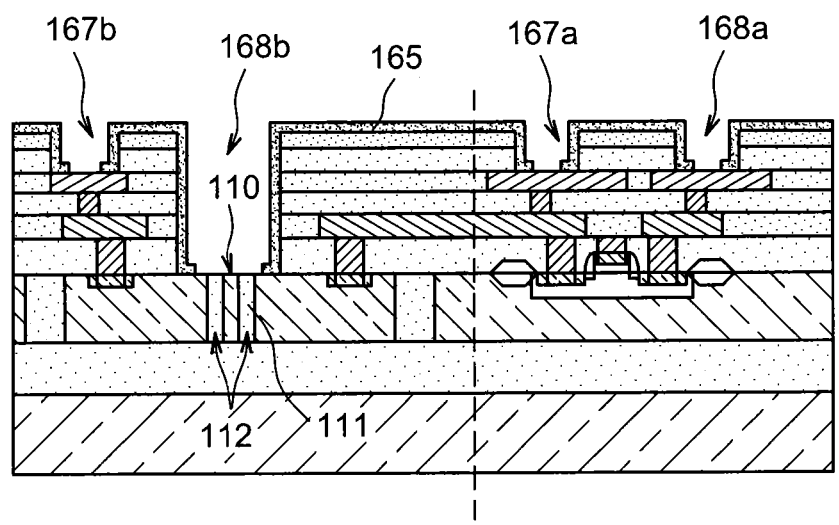

The lay out of the interconnection levels $M_1$, $M_2$, of the cavity 161, and of the block 110 is provided such that the cavity 161, does not reveal any metal line above the block 110. The stacking 143 of layers above the blocks 110 is preferably provided as homogenous as possible as regards the nature of the dielectrics used so as to facilitate the etching step (FIG. 1F).

Figure 3:
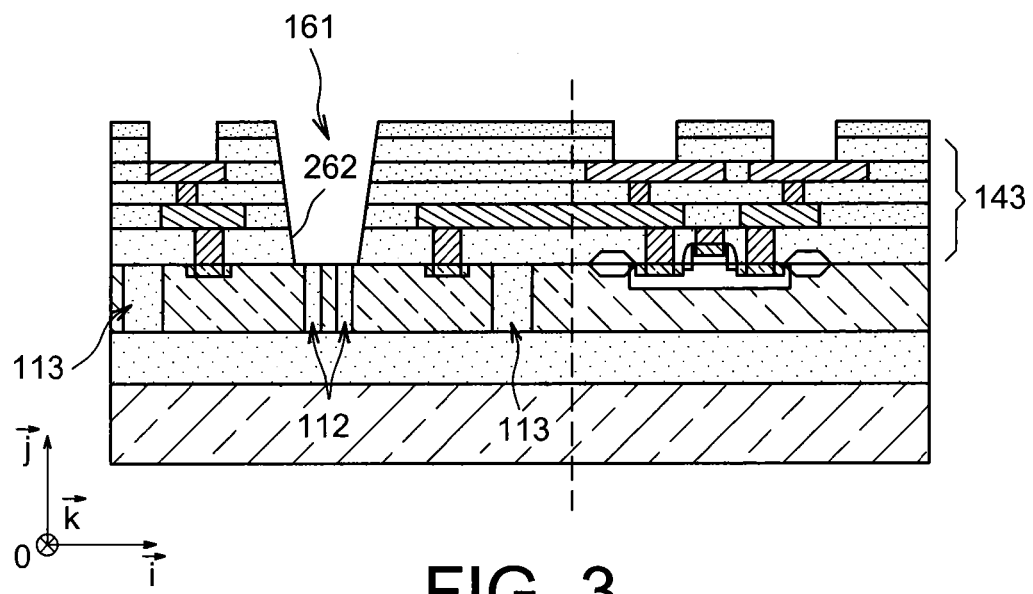
FIG. 3, illustrate an embodiment variant for which a cavity with sloping sides is formed.

In a variant (FIG. 3), the cavities 161, 163, may be formed with sloping walls 262 according to an angle α, for example of the order of several degrees or several tens of degrees with respect to a normal n to the principal plane of the substrate (the principal plane of the substrate being a plane passing through the substrate and parallel to the plane [O; $\vec{i}$; $\vec{j}$] of the reference point [O; $\vec{i}$; $\vec{j}$; $\vec{k}$] given in FIG. 3). This can make it possible to facilitate the formation of a protective layer 165 that may potentially be formed subsequently.

A protective layer 165 may be provided (FIG. 1G) to protect the materials of the stacking 143 and the interconnection levels, during a subsequent step of release of the blocks 110.

The presence of this protective layer 165 makes it possible both to avoid a phenomenon of lateral etching of the stacking 143 during the subsequent release of the blocks 110, and to implement a smaller distance between the metal interconnection lines and the cavities 161.

Thus, the constraints in terms of design rules of the device are reduced which makes it possible to implement a high integration density.

The protective layer 165 is provided based on a material resistant to the subsequent method of etching of the dielectric material 111 and the sacrificial layer 101 that will be formed to release the blocks 110. "Resistant" to the etching method is here taken to mean that the dielectric material 111 and the material of the sacrificial layer 101 could be etched without this leading to significant etching of the layer 165 and preferably without this being able to generate residues of the material of the protective layer during the etching.

The material of the protective layer 165 is also chosen so as to be able to be etched in a selective manner with respect to the material of the blocks 110.

The material of the protective layer 165 is also chosen to be able to be deposited at low temperature, in particular for which the deposition temperature is at the most around 400° C. The material of the protective layer 165 is preferably deposited in a conforming manner in order to be of sufficient thickness on the sides of the stacking 143 in order to assure its protection function.

The protective layer 165 may be for example a layer based on $HfO_2$ making it possible to protect the stacking 143 whereas the release of the blocks 110 is carried out for example by isotropic HF etching.

Other materials such as for example SiC, amorphous Si, silicon nitride, $Al_2O_3$ may potentially be used to form the protective layer 165.

Figure 1H:
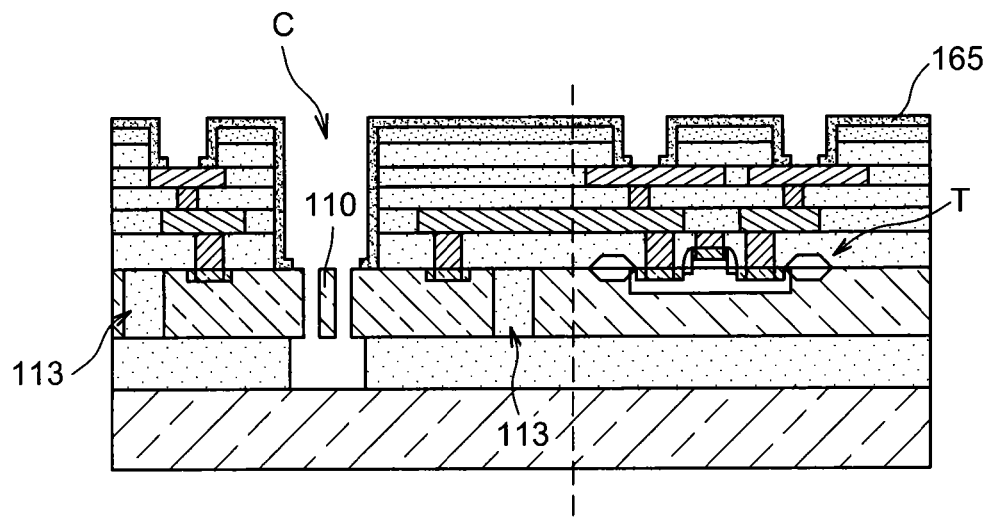
Figure 1I:
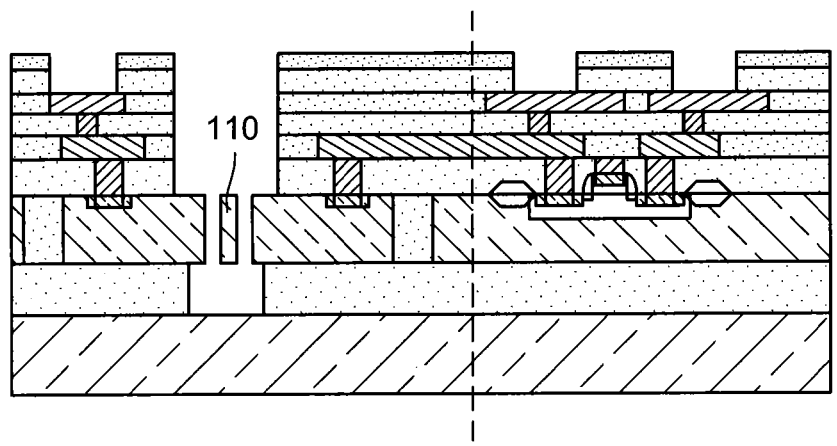

In this protective layer 165, openings 167a, 168a, 167b, 168b are made by photolitho-etching, and in particular openings 168b at the bottom of the cavities 161 so as to reveal the blocks 110 as well as a zone around these blocks 110 (FIG. 1H). As an example, a protective layer based on $HfO_2$ may be etched using a $BCl_3$ type plasma.

At the bottom of the cavities 161, an etching of the dielectric material 111 formed around certain zones of the thin semi-conducting layer 102 is then carried out as well as an isotropic etching of the insulating layer 101 of the substrate. The given semi-conducting block 110 is thereby released.

This step of release (FIG. 1I) of the mechanical structures may be carried out for example by etching using HF, in particular when the dielectric material 111 and that of the insulating layer 101 are based on silicon oxide.

Figure 2D:
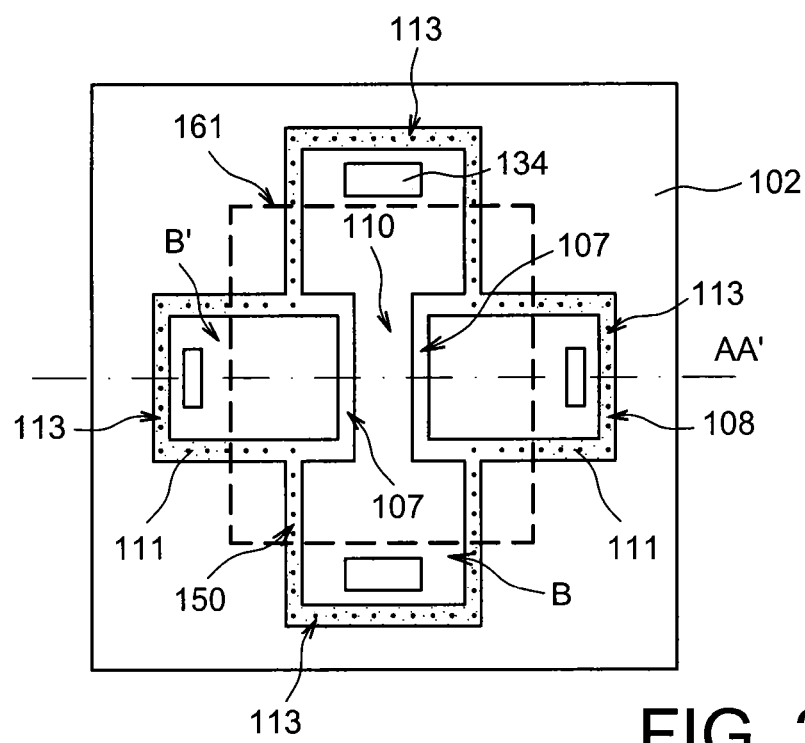

According to a first possibility, in the case where the insulating blocks 113 are revealed only partially by the cavity 161, the step of release may lead to a partial release of portions of the insulating blocks 113 revealed at the bottom of the cavity 161. In this case, at the end of this release step, the insulating closed contour 150 surrounding the component comprises a portion of the trenches 108 filled with dielectric material 111 and an empty portion of the trenches 108 situated inside the cavity 161 and in which the dielectric material 111 has been removed (FIG. 2D).

Figure 6B:
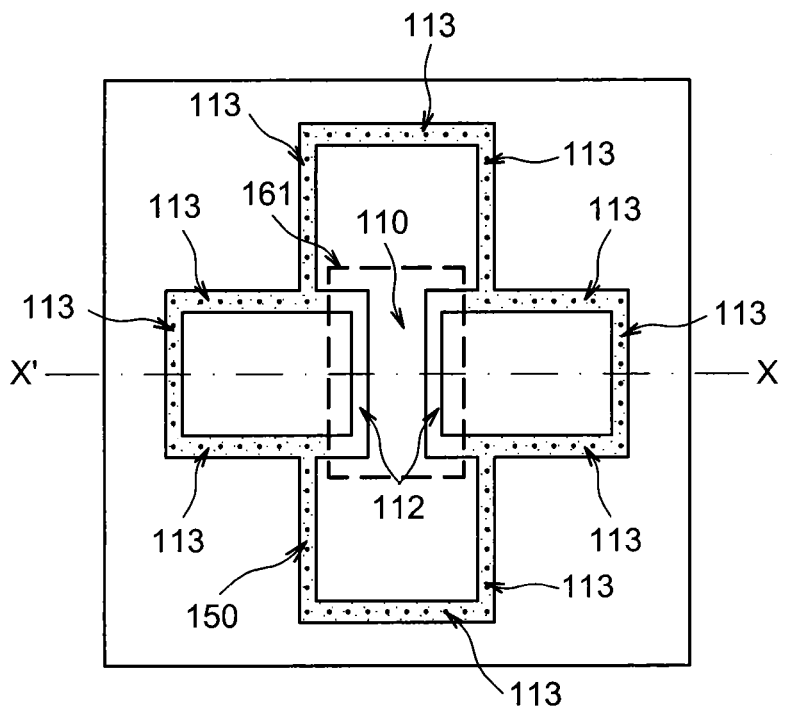

In a variant, in the case where the insulating blocks 113 are not revealed by the cavity 161, the insulating blocks 113 are entirely conserved during the release step. In this case, at the end of the release, the insulating closed contour 150 surrounding the component is formed of trenches 108 entirely filled with dielectric material 111 (FIG. 6B).

The protective layer 165 may potentially be then removed, for example using a $BCl_3$ plasma when it is based on $HfO_2$.

In the example of the method that has been described, a zone of the insulating layer 101 arranged under the given semi-conducting block 110 is sacrificial in so far as it is removed during the method. In a variant, the sacrificial layer may be based on a semi-conducting material different to that of the semi-conducting layer 102 and capable of being etched selectively with respect to that of the layer 102, for example SiGe when the semi-conducting layer 102 is based on Si.

Figure 4A:
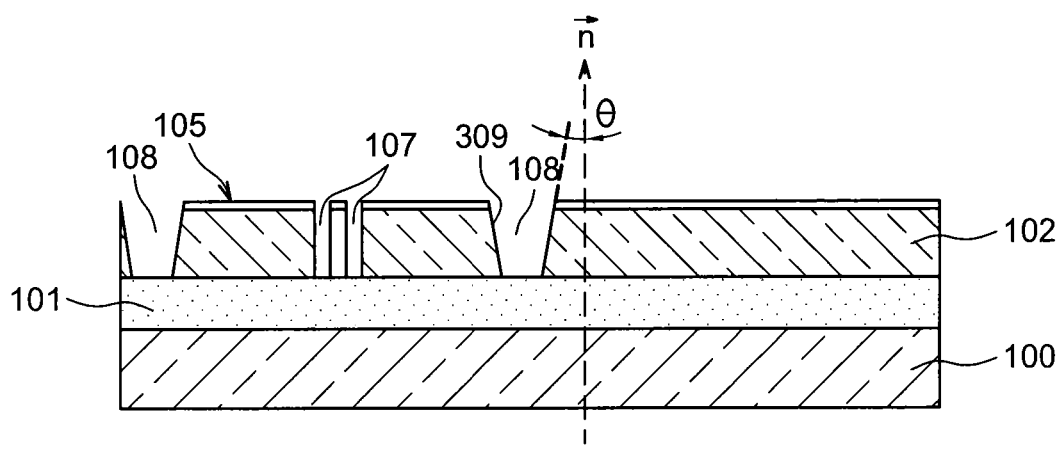
FIGS. 4A-4B illustrate an embodiment variant for which trenches with sloping sides are formed.
Figure 4B:
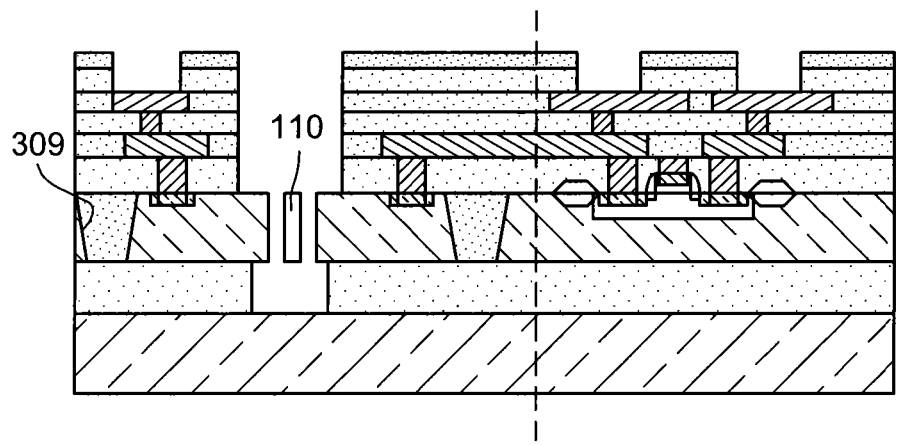

A variant of the method (FIGS. 4A-4B) provides for the implementation of holes 107 and trenches 108 having different profiles. It is possible for example to provide for holes 107 with vertical sides and trenches 108 in which the sides have a non-zero angle θ with a normal to the principal plane of the substrate, in order to facilitate the filling of the trenches 108.

Figure 5:
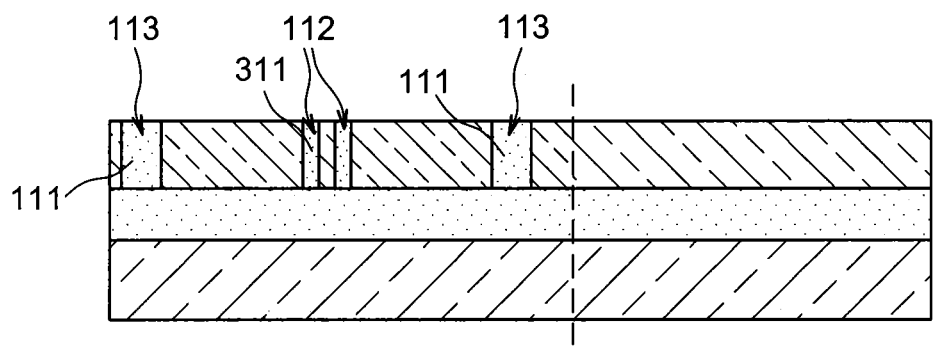
FIG. 5 illustrate an embodiment variant for which holes and trenches are filled with different dielectric materials.

Another variant of the method (FIG. 5) provides for the implementation of sacrificial blocks 112 and insulating blocks 113 with different respective dielectric filling materials 311 and 111.

The sacrificial blocks 112 may be based on a dielectric material 311 having good etching selectivity with respect to the material of the layer 102, whereas the insulating blocks 113 are based on a dielectric material having good electrical insulation and able to fill easily and in a homogenous manner trenches for the "insulating blocks" parts.

The dielectric material 311 for filling the sacrificial blocks may be a silicon oxide $SiO_2$ or instead a dielectric formed for example based on silane ($SiH_4$) or tetraethylorthosilicate (TEOS), a silicon oxide of LTO (Low Temperature Oxide) type formed by LPCVD (Low Pressure Chemical Vapour Deposition) not doped or instead doped with phosphorous or PSG (Phospho-Silicate-Glass) or instead doped with boron and phosphorous or BPSG (Boro-Phospho-Silicate Glass), or an oxide deposited by PECVD (Plasma Enhanced Chemical Vapour Deposition).

The dielectric material 111 used to fill the insulating blocks 113, may also be a silicon oxide, or instead silicon nitride or even a dielectric of type commonly known as "low-k" or "ultra low-k" and carried out by PECVD (Plasma Enhanced Chemical Vapour Deposition) route, such as for example a SiOCH type material, or a material of FSG (Fluorosilicate Glass) type, or in the form of a thin film based on a compound of organo-silica type synthesised for example by sol-gel route.

Figure 7:
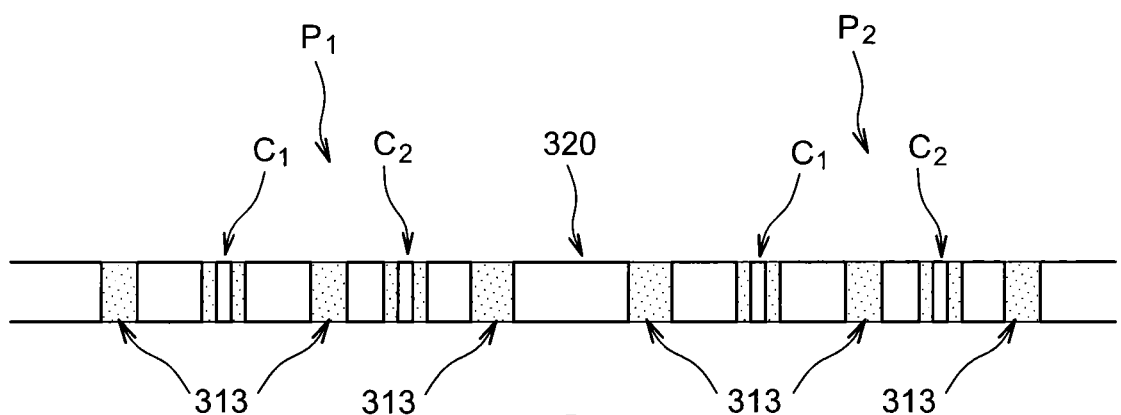
FIG. 7 illustrate a device wherein insulating blocks are formed around the NEMS and in separation regions between two chips.

FIG. 7 illustrates a device wherein insulating blocks 313 of the type of those described in the example of method of FIGS. 1A-1E are formed around structures of NEMS $C_1$, $C_2$ components and near to the frontier regions 320 between several chips $P_1$, $P_2$.

The method that has been described applies to the formation of suspended semi-conducting structures, for example accelerometers, gyrometers, resonators with structures vibrating in flexion or in volume for example.

The method that has been described also applies to the formation of other components with suspended semi-conducting structures, for example to chemical or biological sensors.

The invention claimed is:

1. A method of forming a microelectronic device comprising, on a same substrate comprising a semi-conducting layer, at least one component provided with at least one suspended structure and at least one transistor, the method comprising:
    a) forming, in a first region of the semi-conducting layer, one or more sacrificial blocks arranged on either side or around at least one given block of said semi-conducting layer, and forming one or more electrical insulating blocks of the component, the sacrificial blocks and the insulating blocks being formed by:
        forming first openings and one or more second openings, in said first region of the semi-conducting layer, the at least one given block being defined between said first openings, and then filling the openings with at least one dielectric material, the first openings of said openings being filled with said dielectric material so as to form said sacrificial blocks, and the one or more second openings of said openings different from said first openings being filled with said dielectric material so as to form one or more electrical insulating blocks of the component, the second openings filled with said dielectric material also forming an insulating closed contour around said component;
    b) forming a transistor at a second region of said semi-conducting layer;
    c) forming one or more interconnection levels in at least one insulating layer arranged on said semi-conducting layer;
    d) forming at least one cavity in the at least one insulating layer, revealing at least partially an upper surface of said given block and revealing at least partially an upper surface of said sacrificial blocks arranged on either side or around said given block; and then
    e) removing said sacrificial blocks and a sacrificial layer around said given block, thereby releasing said given block, and thereby forming at least a portion of said at least one suspended structure from said released given block.

2. The method according to claim 1, wherein the step e) of removal is carried out by etching, and wherein, between step d) and step e), a protective layer is formed covering sides and a bottom of the cavity, an opening then being made in said protective layer so as to reveal said given block and said sacrificial blocks arranged on either side or around said given block, the protective layer protecting the at least one insulating layer and the interconnection levels at step e).

3. The method according to claim 2, wherein the sacrificial blocks are based on a dielectric material, the protective layer being based on a material resistant to said etching of said dielectric material and to an etching of the sacrificial layer arranged under said revealed part of said given block carried out at step e).

4. The method according to claim 1, wherein the at least one cavity formed at step d) comprises sloping sides with respect to a normal to the principal plane of the substrate.

5. The method according to claim 4, wherein the openings are formed through a stop layer resting on the semi-conducting layer, the method further comprising, after filling the openings with the dielectric material, a step of removal of the dielectric material extending beyond a mouth of the openings by planarization until the stop layer is reached.

6. The method according to claim 1, wherein the formation of the one or more interconnection levels comprises the formation of an electrical connection conducting line between the at least one component and an electronic component passing above one of the insulating blocks separating and isolating the at least one component and the electronic component.

7. The method according to claim 1, wherein after step a) and prior to step c), doped zones are formed in the first region and the second region of the semi-conducting layer, the method further comprising a step of activation annealing of dopants in the doped zones of the first region and of said second region.

8. The method according to claim 1, wherein the semi-conducting layer is based on monocrystalline silicon.

9. The method according to claim 1, wherein the sacrificial layer is an insulating layer of a semi-conductor on insulator substrate, said insulating layer being intercalated between a semi-conducting support layer and the semi-conducting layer.

10. The method according to claim 1, wherein the filling of the first openings is carried out with a dielectric material different from a dielectric material for the filling of the one or more second openings.

11. The method according to claim 1, wherein the first openings have a profile different from that of the one or more second openings, the one or more second openings comprising sloping sides with respect to a normal to the principal plane of the substrate.

12. The method according to claim 1, wherein at step d) for forming the at least one cavity, the insulating blocks are entirely covered by the insulating layer, the insulating blocks being entirely conserved at step e) of removal of the sacrificial blocks in said at least one cavity.

13. The method according to claim 1, wherein at step d) of forming the at least one cavity, the insulating blocks are partially revealed by the at least one cavity, the insulating blocks being partially conserved at step e) of removal of the sacrificial blocks in said at least one cavity, a portion of the insulating closed contour around said component being conserved at the end of step e) being formed of a portion of the second openings when the dielectric material for filling the second openings has been conserved during step d), and being formed of the portion of the second openings when the dielectric material for filling the second openings has been removed during step d).

14. The method according to claim 1, wherein the filling the openings with at least one dielectric material includes completely filling said openings in said first region of the semi-conducting layer with said dielectric material.

15. The method according to claim 1, wherein the forming the insulating closed contour around said component electrically insulates said component in the first region from said transistor in the second region, and the insulating closed contour is conserved at the end of step e).

* * * * *